United States Patent [19]
Davenport et al.

[11] Patent Number: 4,716,311
[45] Date of Patent: Dec. 29, 1987

[54] DIRECT COUPLED FET LOGIC WITH SUPER BUFFER OUTPUT STAGE

[75] Inventors: William H. Davenport, Hillsboro; Gary D. McCormack; George S. LaRue, both of Beaverton, all of Oreg.

[73] Assignee: TriQuint, Beaverton, Oreg.

[21] Appl. No.: 726,864

[22] Filed: Apr. 25, 1985

[51] Int. Cl.$^4$ .................. H03K 19/017; H03K 17/16; H03K 19/094; H03K 19/12

[52] U.S. Cl. .................................. 307/448; 307/443; 307/450; 307/460; 307/574; 307/581

[58] Field of Search ............... 307/443, 448, 450, 460, 307/581, 574

[56] References Cited

U.S. PATENT DOCUMENTS

| | | | |
|---|---|---|---|
| 4,443,715 | 4/1984 | Fox | 307/578 |
| 4,491,747 | 1/1985 | Shimizu | 307/446 |
| 4,558,235 | 12/1985 | White et al. | 307/448 |

FOREIGN PATENT DOCUMENTS

0117328  7/1984  Japan .................................. 307/446

OTHER PUBLICATIONS

Y. Ikawa et al., "A 1K-Gate GaAs Array", *IEEE Journal of Solid-State Circuits*, vol. SC-19, No. 5, Oct. 1984, pp. 721-727.

H. Nakamura et al., "A 390ps 1000-Gate Array Using GaAs Super-Buffer FET logic" ISSCC *Digest of Technical Papers of 1985 IEEE International* Solid-State Circuits Conference, Feb. 1985, pp. 204 and 205.

*Primary Examiner*—John Zazworsky
*Assistant Examiner*—M. R. Wambach
*Attorney, Agent, or Firm*—John Smith-Hill; William S. Lovell; John D. Winkelman

[57] ABSTRACT

An integrated logic circuit comprises a direct coupled FET logic input stage and a super buffer logic output stage. The input stage comprises a depletion-mode FET having its drain connected to a first reference potential level and having its gate and source connected together, and a first enhancement mode FET structure having its drain connected to the source of the depletion-mode FET, its source connected to a second, lower reference potential level and having at least one gate connected to receive an input logical signal. The super buffer logic output stage comprises a second enhancement mode FET structure that is essentially identical to the first enhancement mode FET structure, the source of the second enhancement mode FET structure being connected to the second reference potential level and the gate of the second enhancement mode FET structure being connected to the gate of the first enhancement mode FET structure. The output stage also comprises a controllable current source connected between the source of the depletion-mode FET and the drain of the second enhancement mode FET structure, for providing drain current to the second enhancement mode FET structure when the potential of the drain of the first enhancement mode FET structure exceeds a predetermined level, and depriving the second enhancement mode FET structure of drain current when the drain of the first enhancement mode FET structure is below the predetermined potential level.

4 Claims, 5 Drawing Figures

DIRECT COUPLED FET LOGIC WITH SUPER BUFFER OUTPUT STAGE

This invention relates to integrated logic circuits.

BACKGROUND OF THE INVENTION

A NOR circuit of the kind that might be implemented in gallium arsenide using enhancement mode and depletion mode MESFET (metal semiconductor field effect transistor) technology is shown at 10 in FIG. 1 of the accompanying drawings. The NOR circuit comprises enhancement-mode MESFETs (EFETs) 14 and 16, which receive input logical signals A and B at their respective gates, have their sources connected to the negative supply $V_{ss}$ and have their drains connected to a node 20, and a depletion-mode MESFET (DFET) 18 that has its drain connected to the positive supply $V_{dd}$ and its gate and source connected to the node 20. The DFET 18 serves as a current source. It will be understood by those skilled in the art that the signal at the node 20 represents the logical operation A NOR B. Normally, the signal at the node 20 would be applied as an input to another logic circuit, such as the inverter shown in FIG. 1 at 12. The inverter 12 is of conventional form and comprises an EFET 22 and a DFET 24.

In an implementation of the circuit shown in FIG. 1 in monolithic integrated form using gallium arsenide as the substrate material, the positive supply $V_{dd}$ may be at about 1.5 to 2.5 volts above the negative supply $V_{ss}$, and the voltage levels, relative to the negative supply $V_{ss}$, corresponding to logical 0 and logical 1, referred to hereinafter as voltage output low (VOL) and voltage output high (VOH) might be 0.1 and 0.7 volts. The threshold value $V_{th}$ for the gate-to-source voltage $V_{gs}$ for the EFETs 14, 16 and 22 might be about 0.25 to 0.4 volts. Therefore, in order to place the EFET 22 reliably in its conductive state, and bring the drain of the EFET 22 to its VOL level, the voltage at the node 20 must exceed the voltage at the source of the transistor 22 by at least 0.4 volts, i.e. $V_{gs}$ for the transistor 22 must be at least 0.4 volts. Ideally, $V_{ss}$ for all the transistors is the same, and if VOH for the transistor 16 is 0.7 volts, then $V_{gs}$ for the transistor 22 will exceed $V_{th}$ by a noise margin of about 0.3 volts and be sufficient to place that transistor reliably in its conductive state. Unfortunately, however, owing to the finite resistance of the conductor runs in an integrated circuit chip, $V_{ss}$ is not generally the same for all the transistors. The variation in $V_{ss}$ among the transistors might be such that $V_{ss}$ for the transistor 16 could exceed $V_{ss}$ for the transistor 22 by as much as 0.3 volts. It will then be understood that if VOL for the transistor 16 is 0.1 volts above $V_{ss}$ for that transistor, $V_{gs}$ for the transistor 22 might equal or exceed $V_{th}$, and consequently the transistor 22 might be placed in its conductive state when it should in fact be placed in its non-conductive state. In order to place the transistor 22 reliably in its non-conductive state when the node 20 is at the VOL level, the VOL level should be brought closer to $V_{ss}$ so as to increase the noise margin.

SUMMARY OF THE INVENTION

In accordance with the present invention, a logic integrated circuit comprises a direct coupled FET logic input stage and a super buffer logic output stage. The input stage comprises a DFET structure with its drain connected to the positive reference potential level and its gate and source connected together, and a first EFET structure having at least one gate connected to receive an input logical signal, the drain of the EFET structure being connected to the source of the DFET structure and the source of the EFET structure being connected to the negative reference potential level. The output stage comprises a second EFET structure that is essentially identical to the first EFET structure, the source of the second EFET structure being connected to the negative reference potential level and the gate of the second EFET structure being connected to the gate of the first EFET structure. The output stage also comprises means for supplying current to the drain of the second EFET structure when the voltage potential of the drain of the first EFET structure exceeds a predetermined level and depriving the second EFET structure of drain current when the drain of the first EFET structure is below the predetermined, potential level.

By cutting off the supply of current to the drain of the second EFET structure when the drain of the first EFET structure is below a predetermined level, a high integrity voltage output low level is established for the super buffer logic output stage of the logic circuit.

The term "super buffer" originates from silicon NMOS technology, and is used in silicon NMOS technology to describe a driver circuit that is approximately symmetrical in its capability of sourcing and sinking charge into a capacitive load. This feature is used in silicon NMOS technology to increase the speed of operation of the logic circuits. In the case of the preferred embodiment of the present invention, which is implemented using gallium arsenide MESFET technology, the super buffer is used to establish a high integrity VOL level for logic circuits. The problem of lack of integrity in the VOL level for logic circuits does not arise in silicon NMOS technology because of the much larger signal level swings, which are typically of the order of volts in a silicon NMOS circuit as compared with hundreds of millivolts in a GaAs MESFET circuit.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
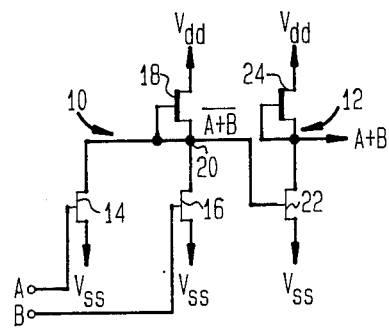
FIG. 1 is a schematic diagram of a conventional NOR circuit connected to a conventional inverter.
Figure 2:
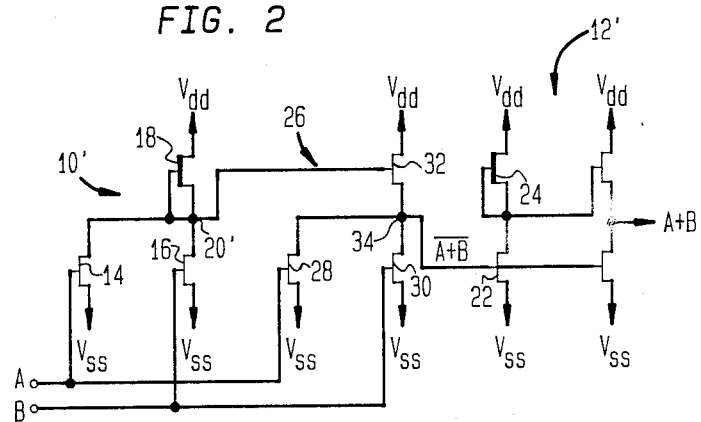
FIG. 2 is a schematic diagram of a NOR circuit embodying the present invention connected to an inverter embodying the invention.

The circuit shown in FIG. 2 is identical to that shown in FIG. 1 except that a super buffer output stage 26 has been incorporated between the node 20 and the gate of the transistor 22. The circuit 10′ then constitutes a DCFL input stage for the NOR circuit and the circuit 26 is the output stage for the NOR circuit.

As shown in FIG. 2, the node 20′ is connected to the gate of a pull-up EFET 32, and the gates of the EFETs 14 and 16 are connected to the gates of respective additional EFETs 28 and 30. The source of the EFET 32 and the drains of the EFETs 28 and 30 are connected together at a node 34 that constitutes the output of the NOR gate and is therefore connected to the gate of the EFET 22. The result is that when both of the input signals A and B are low, so that the node 34 should be at the VOH level, current flows from the node 20' into the gate of the transistor 32 and from the source of the transistor 32 into the gate of the transistor 22, and the node 34 is maintained at the VOH level. On the other hand, if at least one of the input logical signals A and B is high, tending to bring the nodes 20' and 34 to a low level, the transistor 18 provides drain current to at least one of the transistors 14 and 16, taking the voltage at the node 20' to a level, relative to the node 34, that is less than the threshold voltage $V_{th}$ for the transistor 32, and accordingly the transistor 32 is switched off and does not provide current to the transistor 28 or 30. Under these circumstances, the node 34 is pulled down to a considerably lower voltage than is obtained at the node 20 of the circuit shown in FIG. 1. Consequently, the circuit shown in FIG. 2 has a better noise margin with respect to variations in $V_{ss}$ from transistor to transistor.

Figure 3:
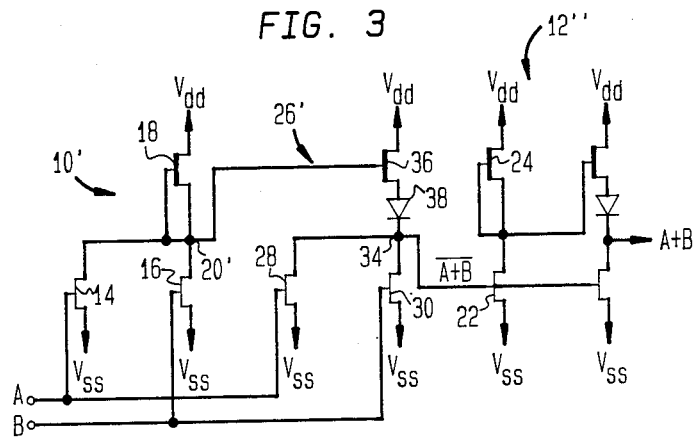
FIG. 3 is a schematic diagram of a combination of a NOR circuit and an inverter, both embodying the present invention.

The circuit illustrated in FIG. 3 differs from that of FIG. 2 in that the transistor 32 of FIG. 2 is replaced in FIG. 3 by a DFET 36 and a diode 38. The DFET 36 remains conductive so long as $V_{gs}$ is higher than a pinch-off voltage of about $-0.4$ volts. If $V_{gs}$ falls below that negative voltage, the transistor 36 is rendered non-conductive. When at least one of the input logical signals A and B is at a high level, and the nodes 20' and 34 tend to assume low potential levels, the diode 38 between the node 34 and the source of the transistor 36, with a potential drop of about 0.5 volts between its anode and cathode even at very low currents, holds the source of the transistor 36 sufficiently positive relative to the node 20' that the transistor 36 is reliably held non-conductive. As before, at least one of the transistors 28 and 30 is conductive and the node 34 is held reliably at the VOL level.

Figure 4:
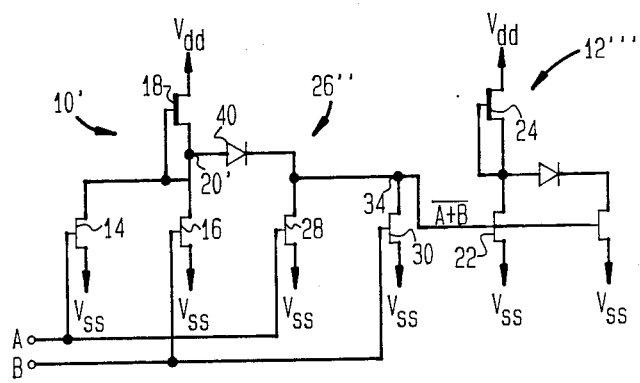
FIG. 4 is a schematic diagram of a third combination of a NOR circuit and an inverter, both embodying the present invention.

In the case of FIG. 4, a diode 40 is connected between the nodes 20' and 34. When both of the input signals A and B are at a low level, each of the nodes 20' and 34 tends to assume a high voltage level, and the voltage across the diode 40 is sufficient to deliver significant current into the node 34. However, when at least one of the input signals is at a high level, the nodes 20' and 34 tend to assume low levels and the voltage across the diode 40 drops, to perhaps about 0.3 volts. Owing to the exponential current-voltage relationship for a diode, the current conducted by the diode falls to a negligible level, and therefore neither of the transistors 28 and 30 receives significant drain current. Consequently the node 34 is held close to $V_{ss}$.

Figure 5:
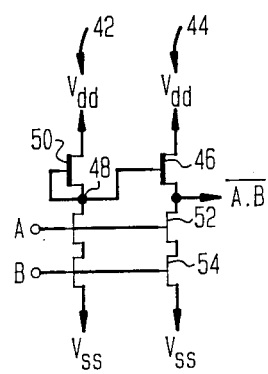
FIG. 5 is a schematic diagram of a NAND circuit embodying the present invention.

The super buffer output stages 26, 26' and 26" shown in FIGS. 2, 3 and 4 respectively, are applicable not only to NOR circuits but also to other logic circuits. By way of example, the inverters 12' shown in FIGS. 2, 3 and 4 are each constructed with a DCFL input stage and a super buffer output stage that has a similar topology to the super buffer output stage of the appropriate NOR circuit. In addition, a NAND circuit is shown in FIG. 5. The NAND circuit comprises an input DCFL stage 42 of conventional form connected at its output to a super buffer output stage 44. When at least one of the input signals is at a low level, so that the node 48 and the source of the EFET 46 both tend towards high values, the DFET 50 provides gate current to the EFET 46, and the source of the EFET 46 is at the VOH level. When both of the signals A and B are at a high level, $V_{gs}$ for the transistor 46 is below the threshold voltage $V_{th}$, and the transistor 46 remains non-conductive, and consequently the source of the transistor 46 is held close to $V_{ss}$ by the EFETs 52 and 54. In general, each logic circuit would include a DCFL input stage and a super buffer output stage to establish a high integrity VOL level for the logic circuit.

It will be appreciated that the invention is not restricted to the particular logic circuits that have been shown and described, and that variations may be made therein without departing from the scope of the invention as defined in the appended claims, and equivalents thereof. For example, although NOR circuits, inverters and NAND circuits have been described, the invention is applicable to other logic circuits. In general, the greater the number of inputs to the logic circuit, the greater is the advantage provided by the present invention.

The super buffer stage comprises an EFET structure that is essentially identical to the EFET structure of the DCFL input stage. This is not intended to mean that the EFET structure of the super buffer stage must be identical in all respects to the EFET structure of the DCFL stage, but only identical in those respects that have a bearing on the present invention. For example, in the case of the NAND circuit shown in FIG. 5, the EFETs 52 and 54 could be replaced by a single EFET having two gates. This would provide the same essential function as the two EFETs 52 and 54 connected in series, and would not involve a departure from the scope of the present invention. The different EFET structures may also have different sizes to allow for different currents and different power dissipations.

Although the invention has been described in connection with an implementation using gallium arsenide as the semiconductor substrate material, the problem of an unreliable VOL level also arises in silicon MESFET technology, and accordingly the invention is not restricted to use with gallium arsenide.

We claim:

1. An integrated logic circuit comprising a direct coupled, FET logic input stage having:
   (a) a depletion-mode FET structure having a gate, a source and a drain, the drain being connected to a first reference potential level and the gate and source being connected together, and
   (b) a first enhancement mode FET structure having at least one gate, a source and a drain, the drain being connected to the source of the depletion-mode FET structure, the source being connected to a second, lower reference potential level and the gate being connected to receive an input logical signal, and a super buffer logic output stage having:
   (c) a second enhancement mode FET structure that is essentially identical to the first enhancement mode FET structure, the source of the second enhancement mode FET structure being connected to said second, lower reference potential level and the gate of the second enhancement mode FET structure being connected to the gate of the first enhancement mode FET structure, and
   (d) a controllable current source connected to the source of the depletion-mode FET structure and to the drain of the second enhancement mode FET structure, for providing drain current to the second enhancement mode FET structure when the drain of the first enhancement mode FET structure exceeds a predetermined potential level and depriving the second enhancement mode FET structure of drain current when the drain of the first enhancement mode FET structure is below said predetermined potential level and wherein the controllable current source comprises a diode and a second depletion-mode FET structure, the gate of the second depletion-mode FET structure being connected to the source of the first-mentioned depletion-mode FET structure, the drain of the second depletion-mode FET structure being connected to the first reference potential level and the source of the second depletion-mode FET structure being connected through said diode to the drain of the second enhancement mode FET structure.

2. A logic circuit according to claim 1, wherein said controllable current source comprises a third enhancement mode FET structure, the third enhancement mode FET structure having a gate, a source and a drain, the drain of the third enhancement mode FET structure being connected to the first reference potential level, the gate being connected to the source of the depletion-mode FET and the source being connected to the drain of the second enhancement mode FET structure.

3. A logic circuit according to claim 1, wherein said controllable current source comprises a diode connected between the source of the depletion-mode FET structure and the drain of the second enhancement mode FET structure.

4. A logic circuit comprising a direct coupled FET logic input stage having:
(a) a depletion-mode MESFET structure having a gate, a source and a drain, the drain being connected to a first reference potential level and the gate and source being connected together, and (b) a first enhancement mode MESFET structure having at least one gate, a source and a drain, the drain being connected to the source of the depletion-mode MESFET structure, the source being connected to a second, lower reference potential level and the gate being connected to receive an input logical signal, and a super buffer logic output stage having:
(c) a second enhancement mode MESFET structure that is essentially identical to the first enhancement mode MESFET structure, the source of the second enhancement mode MESFET structure being connected to said second, lower reference potential level and the gate of the second enhancement mode FET structure being connected to the gate of the first enhancement mode MESFET structure, and (d) a controllable current source connected to the source of the depletion-mode MESFET structure and to the drain of the second enhancement mode MESFET structure, for providing drain current to the second enhancement mode MESFET structure when the drain of the first enhancement mode MESFET structure exceeds a predetermined potential level and depriving the second enhancement mode MESFET structure of drain current when the drain of the first enhancement mode MESFET structure is below said predetermined potential level and wherein the controllable current source comprises a diode and a second depletion-mode FET structure, the gate of the second depletion-mode FET structure being connected to the source of the first-mentioned depletion-mode FET structure, the drain of the second depletion-mode FET structure being connected to the first reference potential level and the source of the second depletion-mode FET structure being connected through said diode to the drain of the second enhancement mode FET structure.

* * * * *